US007859018B2

(12) United States Patent
Iwakami et al.

(10) Patent No.: US 7,859,018 B2
(45) Date of Patent: Dec. 28, 2010

(54) SEMICONDUCTOR DEVICE HAVING NITRIDE SEMICONDUCTOR LAYER

(75) Inventors: Shinichi Iwakami, Niiza (JP); Osamu Machida, Niiza (JP)

(73) Assignee: Sanken Electric Co., Ltd. (JP)

( * ) Notice: Subject to any disclaimer, the term of this patent is extended or adjusted under 35 U.S.C. 154(b) by 208 days.

(21) Appl. No.: 11/490,328

(22) Filed: Jul. 20, 2006

(65) Prior Publication Data

US 2006/0261356 A1    Nov. 23, 2006

Related U.S. Application Data

(63) Continuation of application No. PCT/JP2005/000863, filed on Jan. 24, 2005.

(30) Foreign Application Priority Data

Jan. 28, 2004   (JP)   ............................. 2004-020218

(51) Int. Cl.
*H01L 31/0328* (2006.01)
*H01L 31/0336* (2006.01)
*H01L 31/072* (2006.01)
*H01L 31/109* (2006.01)

(52) U.S. Cl. ............................. 257/194; 257/E29.253; 257/E29.254

(58) Field of Classification Search ............... 257/194, 257/E29.253, E29.254
See application file for complete search history.

(56) References Cited

U.S. PATENT DOCUMENTS 5,357,119 A * 10/1994 Wang et al. ................ 257/18
5,576,570 A * 11/1996 Ohsawa et al. ............. 257/369
6,476,431 B1 * 11/2002 Ohno et al. ................. 257/280

FOREIGN PATENT DOCUMENTS

| JP | 2000-004047 | 1/2000 |
| JP | 2001-168111 | 6/2001 |
| JP | 2003-059948 | 2/2003 |

* cited by examiner

*Primary Examiner*—Howard Weiss
(74) *Attorney, Agent, or Firm*—Woodcock Washburn LLP

(57) ABSTRACT

A semiconductor device having a GaN-based main semiconductor region formed on a silicon substrate via a buffer region. Source, drain and gate electrodes are formed on the main semiconductor region, and a back electrode on the back of the substrate. The substrate is constituted of two semiconductor regions of opposite conductivity types, with a pn junction therebetween which is conducive to a higher voltage-withstanding capability between the drain and back electrodes.

6 Claims, 6 Drawing Sheets

SEMICONDUCTOR DEVICE HAVING NITRIDE SEMICONDUCTOR LAYER

CROSS REFERENCE TO RELATED APPLICATIONS

This is a continuation of Application PCT/JP2005/000863, filed Jan. 24, 2005, which claims priority to Japanese Patent Application No. 2004-020218 filed Jan. 28, 2004.

BACKGROUND OF THE INVENTION

This invention relates to semiconductor devices such as a high electron mobility transistor (HEMT) and metal semiconductor field effect transistor (MESFET), and particularly to those having a nitride semiconductor region on a substrate of silicon or a silicon compound.

The HEMT and MESFET have been known which employ gallium-nitride-based compound semiconductors. Generally, such semiconductor devices had long been formed by creating a gallium-nitride-based semiconductor region on a sapphire substrate via a buffer region. However, besides being expensive, sapphire is so hard that the substrates made therefrom were difficult of dicing. These shortcomings of the sapphire substrate are absent from the substrates that are currently being made from silicon or a silicon compound (hereinafter collectively referred to as the silicon substrate) according to the teachings of Japanese Unexamined Patent Publication No. 2003-59948.

The semiconductor devices of this improved kind proved to possess their own difficulty: They tend to become electrically unstable in the event of potential fluctuations on the back of the silicon substrate in the course of their operation. A known remedy to this difficulty is the creation of an additional electrode on the back of the silicon substrate. Electrically coupled to the source or drain electrode of the device, the back electrode has its potential fixed to that of the source or drain electrode. A drain-source voltage is then applied between the front of the gallium-nitride-based semiconductor region and the back of the silicon substrate.

A problem left unresolved with such semiconductor devices arose from a great difference in linear expansion coefficient between the silicon substrate and the gallium-nitride-based semiconductor region. The difference is such that the semiconductor wafer would suffer a substantive warpage if the gallium-nitride-based semiconductor region were epitaxially grown on the silicon substrate to a thickness in excess of a certain limit. Not only would the wafer warpage adversely affect the electrodes subsequently fabricated on the semiconductor region, but this semiconductor regions itself might be cracked or otherwise impaired, with consequent deterioration of the electrical characteristics of the resulting devices. These deficiencies make it necessary to limit the thickness of the gallium-nitride-based semiconductor region to three micrometers or so even in cases where the multilayered buffer region, taught by the aforesaid unexamined Japanese patent application, is interposed between that region and the silicon substrate.

The gate, drain, and source electrodes are usually arranged side by side on the surface of the gallium-nitride-based semiconductor region in both HEMT and MESFET. The antivoltage strengths between these electrodes may be made sufficiently high for all practical purposes by provision of appropriate spacings therebetween. However, the same spatial scheme is not applicable to the enhancement of antivoltage strength between the surface of the gallium-nitride-based semiconductor region and the back electrode on the silicon substrate because of the noted limitations imposed upon the thickness of the semiconductor region.

It might be contemplated to make the silicon substrate higher in resistance for a greater voltage-withstanding capability. This solution is impractical because the resistivity of the silicon substrate is 1000 ohms per centimeter at most. The silicon substrate is also desired to be as thin as feasible from the standpoint of heat radiation, another reason why the silicon substrate is per se not adaptable for improvement of antivoltage strength. The same holds true with substrates made from silicon carbide or other silicon compounds.

SUMMARY OF THE INVENTION

The present invention has it as an object to improve the voltage-withstanding capability of a semiconductor device of the kind having a nitride semiconductor region on a substrate of silicon or a silicon compound.

For the attainment of the above and other objects the present invention provides a semiconductor device comprising a substrate made from silicon or a silicon compound, a main semiconductor region formed on one of a pair of opposite major surfaces of the substrate and having at least one nitride semiconductor layer, and a first and a second electrode on the main semiconductor region, characterized in that the substrate has a pn junction.

A buffer region of a nitride semiconductor may additionally be interposed between the substrate and the main semiconductor region.

Means may additionally be provided for fixing the potential of the other major surface of the substrate with respect to the potential of the first or the second electrode. More specifically, the said other major surface of the substrate may be fixed either at the same potential as, or at a prescribed potential difference from, the first or the second electrode.

The said potential fixing means may comprise an electroconductive layer (e.g., back electrode) formed on the said other major surface of the substrate, and a conductor connecting the electroconductive layer to the first or the second electrode.

The substrate and the buffer region may be adapted to provide a pn junction therebetween.

The buffer region may be a lamination of a plurality of semiconductor layers having a pn junction therebetween.

Another form of semiconductor device for the attainment of the objects above comprises a substrate made from silicon or a silicon compound, a buffer region formed on one of a pair of opposite major surfaces of the substrate and adapted to provide a pn junction between itself and the substrate, a main semiconductor region formed on the buffer region and having at least one nitride semiconductor layer, a first and a second electrode on the main semiconductor region, and means for fixing the potential of the other major surface of the substrate with respect to the potential of either of the first and the second electrode.

In the above semiconductor device having a pn junction between substrate and buffer region, the buffer region may be a lamination of a plurality of buffer layers including one which is in direct contact with the substrate and which is opposite in conductivity type to the substrate.

Still another form of semiconductor device according to the invention comprises a substrate made from silicon or a silicon compound, a buffer region formed on one of a pair of opposite major surfaces of the substrate, a main semiconductor region formed on the buffer region and having at least one nitride semiconductor layer, a first and a second electrode on the main semiconductor region, and means for fixing the potential of the other major surface of the substrate with respect to the potential of either of the first and the second electrode. The buffer region is a lamination of alternating first and second buffer layers, each first buffer layer containing aluminum in a first proportion, each second buffer layer containing aluminum in a second proportion that is either zero or less than the first proportion. At least one of the first buffer layers and at least one of the second buffer layers are adapted to provide a pn junction therebetween.

The invention is particularly characterized by the provision of a pn junction either within the silicon or silicon compound substrate, between the substrate and the buffer region, or within the buffer region. Antivoltage strength between the surface of the main semiconductor region and the back of the substrate is enhanced as the pn junction is reverse biased in use of the semiconductor device.

DETAILED DESCRIPTION OF ILLUSTRATIVE EMBODIMENTS

Figure 1:
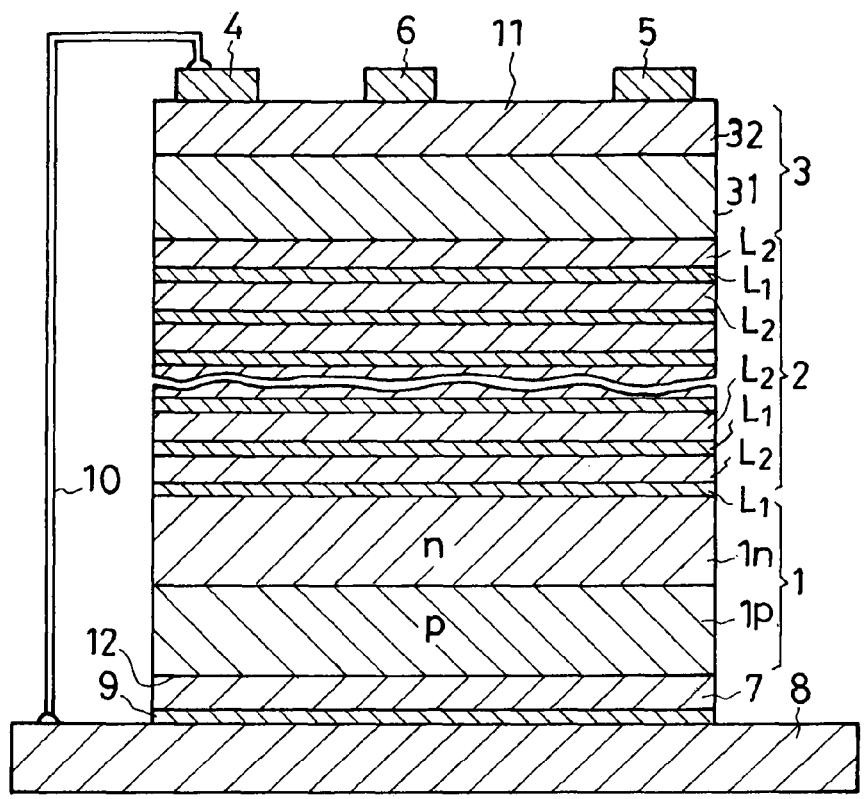
FIG. 1 is a schematic, partly broken away sectional view showing the present invention as embodied in a HEMT by way of one possible application of the invention.

The invention will now be described more specifically as embodied in the HEMT shown partly broken away in FIG. 1. The exemplified HEMT broadly comprises a silicon substrate 1, a buffer region 2 overlying the substrate 1, a main semiconductor region 3 overlying the buffer region 2 and configured to provide a HEMT, a source 4 as a first electrode, a drain 5 as a second electrode and gate 6 as a control electrode, a back electrode 7 on the back of the silicon substrate 1, a metal-made baseplate 8 on which the silicon substrate 1 is mounted via an electroconductive bonding layer 9, and a conductor 10 electrically connecting the source electrode 4 to the baseplate 8.

The silicon substrate 1 is formed to include a p-type semiconductor region $1_p$ and an n-type semiconductor region $1_n$. Lying contiguous to the back electrode 7, the p-type semiconductor region $1_p$ of the substrate 1 contains boron or like Group III element as a conductivity-type determinant. Overlying the p-type semiconductor region $1_p$, the n-type semiconductor region $1_n$ of the substrate 1 contains phosphorous or like Group V element as a conductivity type determinant. Thus is the substrate 1 adapted to provide a pn junction between its pair of opposite major surfaces contiguous respectively to the buffer region 2 and back electrode 7. This pn junction is conducive to the improvement of the antivoltage strength of the HEMT.

The substrate 1 of the foregoing configuration may be fabricated either by:

1. Epitaxially growing an n-type semiconductor layer on a p-type semiconductor substrate;
2. Diffusing an n-type impurity to a limited depth into a p-type semiconductor substrate;
3. Epitaxially growing a p-type semiconductor layer on an n-type semiconductor substrate; or
4. Diffusing a p-type impurity to a limited depth into an n-type semiconductor substrate.

The p-type semiconductor region $1_p$ of the substrate 1 may have a p-type impurity concentration of $1 \times 10^{13}$ cm$^{-3}$, and the n-type semiconductor region $1_n$ an n-type impurity concentration of $1 \times 10^{14}$ cm$^{-3}$. Desirably, that major surface of the substrate 1 which is held against the buffer region 2 is exactly (111) in terms of a Miller index. The substrate 1 should be sufficiently thick (e.g., 350 micrometers) to serve as a mechanical support for the overlying buffer region 2 and main semiconductor region 3.

Overlying one complete major surface of the substrate 1, the buffer region 2 is multilayered, comprising a plurality or multiplicity of alternations of a first layer $L_1$ and second layer $L_2$. The first buffer layers $L_1$ are made from a nitride semiconductor containing a prescribed proportion of aluminum. The second buffer layers $L_2$ are made from a nitride semiconductor containing aluminum in a lesser proportion than do the first buffer layers $L_1$ or not containing it at all. Typically, the buffer region 2 has twenty first layers $L_1$ and as many second layers $L_2$. Speaking more broadly, the buffer region 2 may have from two or two hundreds, preferably from twenty to eighty, first layers $L_1$ and as many second layers $L_2$. The lowermost one of the first buffer layers $L_1$ is directly held against the n-type region $1_n$ of the substrate 1.

The first layers $L_1$ of the buffer region 2 are made from any of the aluminum-containing nitride semiconductors that are generally defined as:

$$Al_x M_y Ga_{1-x-y} N$$

where M is at least either of indium and boron; the subscript x is a numeral that is greater than zero and equal to or less than one; the subscript y is a numeral that is equal to or greater than zero and less than one; and the sum of x and y is equal to or less than one. Preferred compounds meeting this formula include aluminum nitride (AlN), aluminum indium nitride (AlInN), aluminum gallium nitride (AlGaN), aluminum indium gallium nitride (AlInGaN), aluminum boron nitride (AlBN), aluminum boron gallium nitride (AlBGaN), and aluminum boron indium gallium nitride (AlBInGaN).

The material employed for the first buffer layers $L_1$ in this particular embodiment of the invention is AlN (both x and y are zero in the formula above). The first buffer layers $L_1$ are relatively high in resistivity and closer in both lattice constant and thermal expansion coefficient to the substrate 1 than are the second buffer layers $L_2$. Desirably, the first buffer layers $L_1$ should be less in lattice constant than the second buffer layers $L_2$.

The first buffer layers $L_1$ may range in thickness from 0.5 nanometer to 50.0 nanometers. If they were less than 0.5 nanometer thick, the main semiconductor region 3 might not be formed on the buffer region 2 with a desired degree of flatness. Should they be more than about 50 nanometers thick, on the other hand, then the first buffer layers $L_1$ might crack from lattice mismatch with the second buffer layers $L_2$ or from tensile stresses due to a difference in thermal expansion coefficient from the substrate 1.

Having a lattice constant intermediate those of silicon and gallium nitride, the first buffer layers $L_1$ favorably conforms to the crystal orientation of the substrate 1. The main semiconductor region 3 can also be formed with good crystal orientation on the buffer region 2. It has actually proved that the main semiconductor region 3 formed on the buffer region 2 is favorable in both flatness and electrical characteristics. No such main semiconductor region would be grown on a buffer region made solely from gallium nitride by reason of too great a difference in lattice constant between silicon and gallium nitride.

The second layers $L_2$ of the buffer region 2 are made from any of the nitride semiconductors that are generally expressed by the formula:

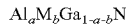

$$Al_a M_b Ga_{1-a-b} N$$

where M is at least either of indium and boron; the subscript a is a numeral that is equal to or greater than zero, less than one, and less than x in the formula above generally defining the composition of the first buffer layers $L_1$; the subscript b is a numeral that is equal to or greater than zero and equal to or less than one; and the sum of a and b is equal to or less than one.

Preferred compounds meeting the above compositional definition of the second buffer layers $L_2$ include gallium nitride (GaN), aluminum indium nitride (AlInN), aluminum gallium nitride (AlGaN), aluminum indium gallium nitride (AlInGaN), aluminum boron nitride (AlBN), aluminum boron gallium nitride (AlBGaN), and aluminum boron indium gallium nitride (AlBInGaN). The second buffer layers $L_2$ may, or may not, contain aluminum. The proportion of aluminum, if it is contained at all, should preferably be less than 0.8 in the formula above in order to preclude the risk of cracking. The material employed for the second buffer layers $L_2$ in this particular embodiment of the invention is GaN (a=0, b=0).

The second buffer layers $L_2$ should each be from about 0.5 nanometer to about 200 nanometers thick. If they were less than about 0.5 nanometer thick, the first buffer layers $L_1$ might not be formed thereon with a desired degree of flatness, nor might the main semiconductor region 3 be on the resulting multilayered buffer region 2. Should they be more than about 200 nanometers thick, on the other hand, then the main semiconductor region 3 would be adversely affected by the compressive stresses developing in the second buffer layers $L_2$ as a result of lattice mismatch between the first and the second buffer layers $L_1$ and $L_2$. Specifically, in the case of a HEMT, the channel layer would suffer a drop in electron density to the detriment of its performance.

Preferably, the second buffer layers $L_2$ should each be thicker than each first buffer layer $L_2$. The straining of the first buffer layers $L_1$ due to lattice mismatch with the second buffer layers $L_2$ and to a different thermal expansion coefficient from that of the substrate 1 will then be reduced to such an extent as to save the first buffer layers from cracking. The channel layer of the HEMT will also be higher in electron density.

Indium may be contained in either or both of the first and the second buffer layers $L_1$ and $L_2$ (i.e., $Al_x In_y Ga_{1-x-y} N$ and/or $Al_a In_b Ga_{1-a-b} N$). Indium contained in at least either of the first and the second buffer layers $L_1$ and $L_2$ will serve to prevent the straining of the buffer region 2 from a difference in thermal expansion coefficient between the substrate 1 and the buffer region 2.

Boron may also be contained in either or both of the first and the second buffer layers $L_1$ and $L_2$ (i.e., $Al_x B_y Ga_{1-x-y} N$ and/or $Al_a B_b Ga_{1-a-b} N$). Boron contained in at least either of the first and the second buffer layers $L_1$ and $L_2$ will render the buffer region 2 closer in thermal expansion coefficient to the substrate 1. The buffer region 2 will then suffer less deformation from a difference in thermal expansion coefficient between the substrate 1 and the buffer region 2.

With continued reference to FIG. 1, for provision a HEMT, itself well known in the art, the main semiconductor region 3 is shown to comprise an electron transit or channel layer 31 directly overlying the multilayered buffer region 2, and an electron supply layer 32 on the electron transit layer. The electron transit layer 31 is of undoped GaN while the electron supply layer 12 is of $Al_{0.2} Ga_{0.8} N$ doped with silicon into n type. Generally, these constituent layers 31 and 32 of the main semiconductor region 3 may be of gallium-nitride-based semiconductors. As the name implies, the electron supply layer 32 supplies to the electron transit layer 31 the electrons generated by the n-type impurities. Optionally, a known spacer layer might be interposed between electron transit layer 31 and electron supply layer 32 for restricting the diffusion of the silicon dopant from the latter into the former. The main semiconductor region 3 is approximately one micrometer thick in this particular embodiment.

Figure 2:
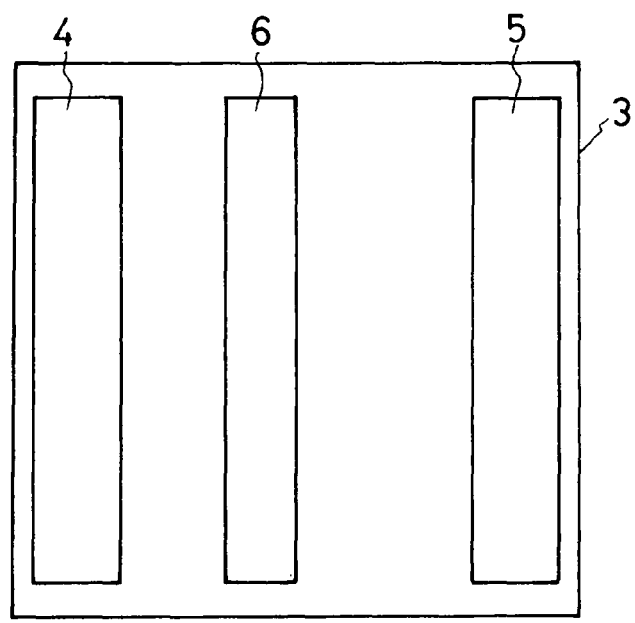
FIG. 2 is a top plan view showing part of the HEMT of FIG. 1.

As depicted in both FIGS. 1 and 2, the source 4, drain 5 and gate 6 are all in the shape of elongate strips, arranged side by side on the top or front major surface 11 of the main semiconductor region 3. The source 4 and drain 5 make ohmic contact with the electron supply layer 32 of the main semiconductor region 3 whereas the gate 6 makes Schottkey contact therewith. The source 4 and drain 5 could both be held against the electron supply layer 32 via contact layers which were higher in n-type impurity concentration than that layer 32.

As is well known in the art, there is generated between electron transit layer 31 and electron supply layer 32 a so-called two-dimensional electron gas layer through which electrons flow. When the HEMT is on, the electrons flow along the path sequentially comprising the source 4, electron supply layer 32, electron transit layer 31 including the two-dimensional electron gas layer, electron supply layer 32, and drain 5. This electron current is under the control of a voltage applied to the gate 6.

The back electrode 7 covers all the bottom or back surface of the substrate 1 in ohmic contact therewith. The back electrode 7 is joined, both mechanically and electrically, to the metal-made baseplate 8 via the layer 9 of an electroconductive bonding agent. The baseplate 8 is electrically coupled in turn to the source 4 via the conductor 10. Therefore, electrically coupled to the source 4 via the bonding layer 9, baseplate 8 and conductor 10, the back electrode 7 has its potential fixed to that of the source 4. The means for fixing the potential of the other major surface of the substrate 1 comprises the back electrode 7, the electroconductive bonding agent layer 9, the baseplate 8 and the conductor 10.

Described hereinbelow is a method of making the HEMT of the FIGS. 1 and 2 configuration, in which the first layers $L_1$ of the buffer region 2 are of AlN, and the second layers $L_2$ thereof are of GaN.

There was first prepared the silicon substrate 1 having the p-type semiconductor region $1_p$ and n-type semiconductor region $1_n$. The major surface of this substrate, on which there was to be grown the multilayered buffer region 2, was exactly (111) in terms of Miller indices of crystal orientation. Broadly speaking, however, departures from this plane in either direction are permissible within an angle of plus or minus four degrees, preferably plus or minus three degrees, and most desirably plus or minus two degrees. The (111) crystal orientation, possibly with minimal departures therefrom, of the major surface of the substrate 1 is conducive to the appearance of little or no atomic-level steps during the epitaxial growth of the multilayered buffer region 2 and double-layered main semiconductor region 3 thereon.

Then the multilayered buffer region 2 was created on the major surface $1_a$ of the substrate 1 by alternately laminating the first layers $L_1$ of AlN and second layers $L_2$ of GaN. The particular method employed here was metal organic chemical vapor deposition (MOCVD), a type of epitaxial growth well known in the semiconductor industry.

More specifically, after having been pretreated with a hydrofluoride-based etchant, the substrate was introduced into an MOCVD reactor and had oxide films stripped off its surfaces by thermal annealing at 950° C. for about 10 minutes. Then one first buffer layer $L_1$ of AlN was formed on the major surface of the substrate 1 to a thickness of about 10 nanometers by heating the substrate 1 to 1120° C. and charging both trimethylaluminum (TMA) and ammonia ($NH_3$) gases into the reactor for approximately 65 seconds. The TMA gas (i.e. aluminum) was introduced at about 63 micromoles per minute, and the $NH_3$ gas (i.e. $NH_3$) at about 0.14 mole per minute.

Then, after terminating the supply of TMA gas, and with the substrate 1 held heated to 1120° C., both trimethyl gallium (TMG) gas and $NH_3$ gas were introduced into the reactor for about 90 seconds. There was thus created on the preformed first buffer layer $L_1$ one second buffer layer $L_2$ of n-type GaN to a thickness of about 30 nanometers. The TMG gas (i.e. gallium) was introduced at about 60 micromoles per minute, and the $NH_3$ gas (i.e. $NH_3$) at about 0.14 mole per minute.

Thereafter the fabrication of another first buffer layer $L_1$ of AlN on the preformed second buffer layer 9, and of another second buffer layer $L_2$ of GaN on the preformed first buffer layer was repeated nineteen times. There was thus completed the multilayered buffer region 2 consisting of twenty alternations of first buffer layers $L_1$ and second buffer layers $L_2$. As has been mentioned, a different number, say 50, of first buffer layers $L_1$ and of second buffer layers $L_2$ could have been made in the same way within the scope of the invention.

The MOCVD method was also adopted for creation of the main semiconductor region 3 on the multilayered buffer region 2. With the substrate 1, complete with the multilayered buffer region 2 thereon, placed in the MOCVD reactor, both trimethylgallium (TMG) gas and $NH_3$ gas were fed into the reactor until there was formed an electron transit layer 31 of undoped GaN to a thickness of 500-1000 nanometers on the surface of the multilayered buffer region 2. The TMG gas (i.e. gallium) was charged at about 62 micromoles per minute, and the $NH_3$ gas (i.e. $NH_3$) at about 0.23 mole per minute.

Then TMA, TMG, $NH_3$ and silane ($SiH_4$) gases were introduced into the reactor until an electron supply layer 32 of $Al_{0.2}Ga_{0.8}N$ was deposited on the surface of the electron transit layer 31 to a thickness of 10 nanometers. The TMA gas was introduced at 8.4 micromoles per minute, the TMG gas at 15 micromoles per minute, the $NH_3$ gas at about 0.23 mole per minute, and the $SiH_4$ gas at 21 nanomoles per minute.

Next came the steps of fabricating the electrodes 4-7. The source 4 and drain 5 were made from titanium and aluminum, and the gate 6 from nickel and gold, although a combination of palladium, titanium and gold could have been employed for the latter. The back electrode 7 was formed on the back surface 12 of the substrate 1. Then this back electrode 7 was joined to the metal-made baseplate 8 via the electroconductive bonding layer 9. Then the baseplate 8 was wired as at 10 to the source 4.

The first preferred embodiment of the present invention, configured as drawn in FIGS. 1 and 2 and fabricated as set forth hereinbefore, has proved to offer the following advantages:

1. Electrically coupled to the source 4 via the conductive bonding layer 9, metal-base baseplate 8 and conductor 10, the back electrode 7 is held at the same potential (e.g., ground potential) as that of the source. The HEMT is bound to operate more stably as the back electrode 7 and therefore the silicon baseplate 1 are thus maintained at an unfluctuating potential throughout the operating period of the device.

2. Despite the electrical coupling of the back electrode 7 to the source 4 as above, no rupture occurs between drain 5 and back electrode 7 by virtue of higher antivoltage strength therebetween thanks to the presence of the pn junction in the substrate 1. Although shown exaggerated in FIG. 1, the thicknesses of the buffer region 2 and main semiconductor region 3 are actually very small compared to the spacing between source 4 and drain 5. Also, the substrate 1 will behave essentially as a conductor if it is of a single conductivity type. Anti-voltage strength between drain 5 and back electrode 7 is therefore of greater significance than that between source 4 and drain 5. The drain 5 is higher in potential than the back electrode 7 when the HEMT is off, with the result that the pn junction between the two constituent layers $1_p$ and $1_n$ of the substrate is reverse biased. Thus the substrate 1 becomes electrically resistive, assuring a sufficiently high voltage-withstanding capability between drain 5 and back electrode 7 for all practical purposes.

3. The HEMT of FIG. 1 has the metal-made baseplate 8. Also, the substrate 1 can be of minimal thickness as it incorporates a pn junction for improved strength against voltages. As the substrate thus offers little or no thermal resistance between main semiconductor region 3 and metal-made baseplate 8, the heat generated in the main semiconductor region is easy to be radiated through the baseplate 8.

4. With the substrate 1 made from silicon, the HEMT is manufacturable less expensively than that having a sapphire substrate because silicon is not only cheaper but additionally easier of machining than its more conventional alternative.

5. Made up of alternations of the first layers $L_1$ of AlN, which is intermediate in lattice constant between silicon and GaN, and the second layers $L_2$ of GaN, the buffer region 2 favorably conforms to the crystal orientation of the underlying substrate. The main semiconductor region 3 of gallium-nitride-based semiconductors can also be grown on the buffer region 3 with its crystal orientation aligned and with a high degree of flatness. The resulting HEMT has good electrical characteristics. Contrary to the teachings of the instant invention, should the buffer region be fabricated solely from a gallium nitride semiconductor at low temperatures, the gallium-nitride-based main semiconductor region would not be formed thereon with a desired degree of flatness by reason of a difference in lattice constant between silicon and gallium nitride.

6. The buffer region 2 of alternating AlN and GaN layers $L_1$ and $L_2$ can be grown at higher temperatures than the more conventional monolayered buffer region of gallium nitride or aluminum nitride only. The higher temperature growth of the buffer region leads to a more complete decomposition of ammonia employed as a nitrogen source, preventing the buffer region 2 from becoming amorphous. Grown epitaxially on this buffer region 2, the main semiconductor region 3 will be sufficiently low in the density of crystal defects to prevent current leakage. All in all, the HEMT will be obtained which has a very good pinch-off characteristic.

7. Heat radiation is easier through the silicon substrate 1, silicon being better in heat conductivity than sapphire, resulting in improvement in device characteristics such as voltage-withstanding capability and gain.
8. Since silicon is less in thermal expansion coefficient than nitride-based semiconductors, the layers grown epitaxially on the silicon substrate are subjected to tensile strain due to thermal mismatch. As a result, the tensile stress along the interface between electron transit layer 31 and electron supply layer 32 can be augmented for higher piezoelectric polarization. The electron transit layer 31 can thus be made higher in electron density than in the case where a sapphire substrate is used, and decreased in sheet resistance for the flow of a greater amount of drain current.

Figure 3:
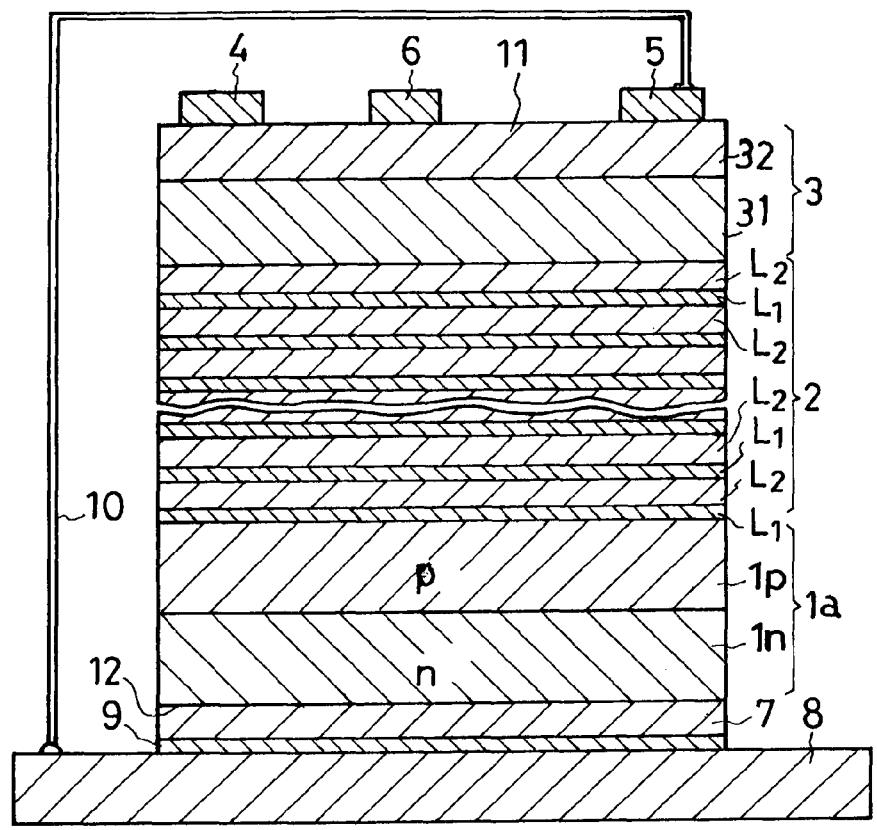
FIG. 3 is a view similar to FIG. 1 but showing another preferred form of HEMT according to the invention.

Embodiment of FIG. 3

The silicon substrate 1 of the FIG. 1 embodiment is modifiable as indicated at $1_a$ in FIG. 3. The modified substrate $1_a$ has an n-type semiconductor region $1_n$ contiguous to the back electrode 7 and a p-type semiconductor region $1_p$ contiguous to the multilayered buffer region 2. The second preferred form of HEMT shown in this figure also differs from that of FIG. 1 in that the metal-made baseplate 8 is electrically coupled to the drain 5 via the wire 10. All the other details of construction are as set forth above with reference to FIGS. 1 and 2.

During the normal operation of the HEMT the pn junction within the substrate $1_a$ is reverse biased when the potential of the drain 5, and therefore of the back electrode 7, is higher than that of the source 4. Higher antivoltage strength is thus obtained between source 4 and back electrode 7. It is therefore apparent that this HEMT gains all the advantages as does the HEMT of FIGS. 1 and 2.

Figure 4:
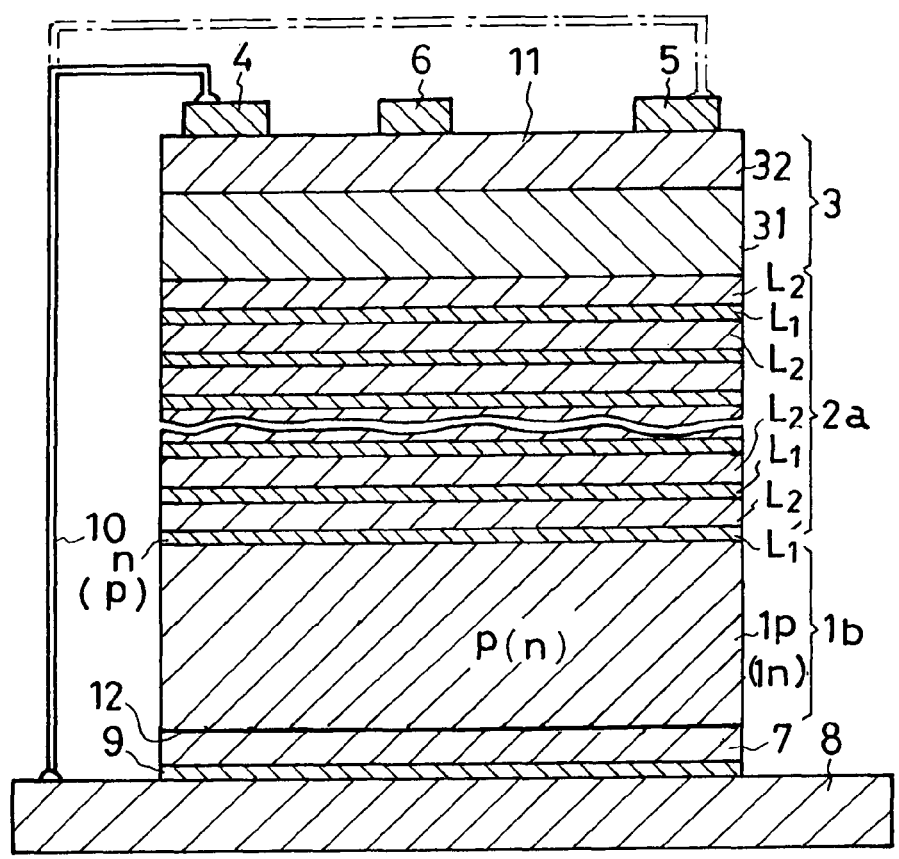
FIG. 4 is a view similar to FIG. 1 but showing still another preferred form of HEMT according to the invention.

Embodiment of FIG. 4

This third preferred form of HEMT shown in FIG. 4 incorporates another modified silicon substrate $1_b$ and a modified buffer region $2_a$, all the other details of construction being as above described with reference to FIGS. 1 and 2. The substrate $1_b$ consists solely of a p-type semiconductor region $1_p$. Although having no internal pn junction, the substrate $1_b$ does provide a pn junction in combination with the lowermost first layer $L_1'$, which is of n-type AlN, of the overlying multilayered buffer region $2_a$. This pn junction functions just like the internal pn junctions of the above disclosed silicon substrates 1 and $1_a$, reverse-biased during normal operation of the HEMT and so serving for higher antivoltage strength.

It will now be self-evident that the substrate $1_b$ could be wholly of n type, and that the lowermost layer $L_1'$ of the buffer region $2_a$ could be of p-type AlN. As indicated by the broken lines in FIG. 4, the baseplate 8 might then be wired to the drain 5. Furthermore, purely for providing a pn junction in combination with the silicon substrate of a single conductivity type, the buffer region could be wholly of an n-type semiconductor if the substrate was of p type, and wholly of a p-type semiconductor if the substrate was of n type. It is also possible to replace the substrate $1_b$ of this embodiment with the double-layered substrate 1 or $1_a$ of FIG. 1 or 3. Two pn junctions would then be obtained for further enhancement of antivoltage strength, one inside the substrate and another between substrate and buffer region.

Figure 5:
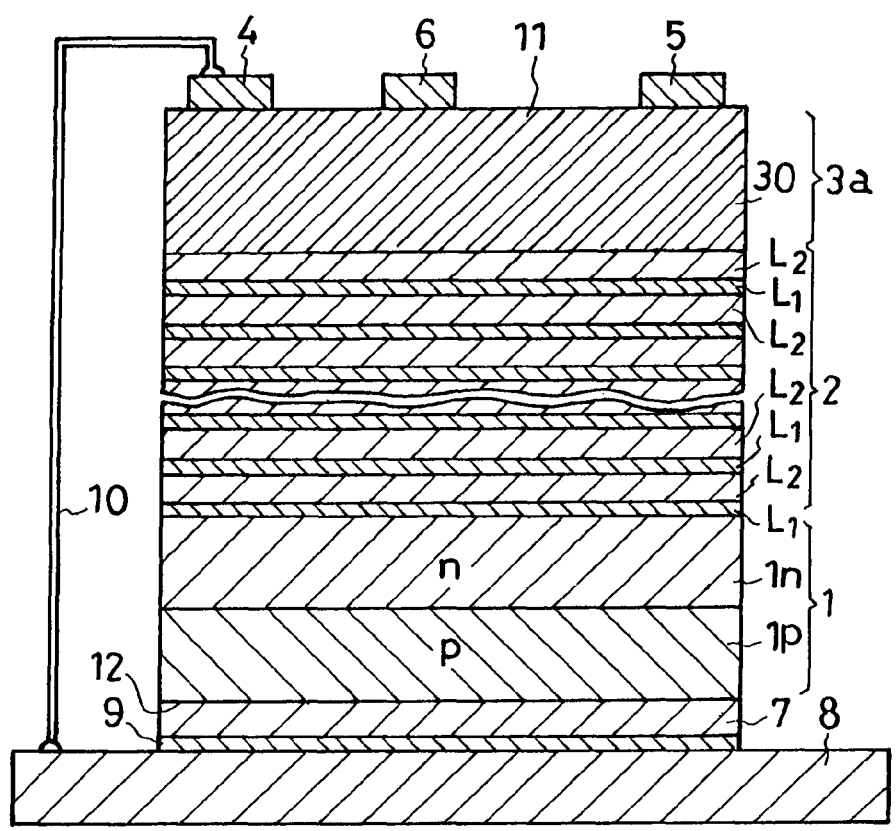
FIG. 5 is a view similar to FIG. 1 but showing the present invention as embodied in a MESFET by way of another possible application of the invention.

Embodiment of FIG. 5

The present invention is shown here as embodied in a MESFET, which includes a main semiconductor region $3_a$ having but one semiconductor layer 30 of GaN doped with silicon into n type. All the other parts of the MESFET, including the substrate 1, multilayered buffer region 2, source 4, drain 5, gate 6, baseplate 8, electroconductive bonding layer 9, and conductor 10, are akin to their FIG. 1 counterparts indicated by like reference numerals. The n-type semiconductor layer 30, which might be also called a channel or active layer, of the main semiconductor region $3_a$, overlies the buffer region 2. Both source 4 and drain 5 make ohmic contact with this n-type semiconductor layer 30 whereas the gate 6 makes Schottky barrier contact therewith.

All but the n-type semiconductor layer 30 of this MESFET is manufacturable by the same method as detailed above in conjunction with the HEMT of FIGS. 1 and 2. The n-type semiconductor layer 30 was formed by introducing TMG. $NH_4$ and $SiH_4$ gases into the same reactor as that used for creation of the multilayered buffer region 2, for about 450 seconds. The TMG gas (i.e., Ga) was charged at 60 micromoles per minute, the $NH_3$ gas (i.e., $NH_3$) at 0.23 mole per minute, and the $SiH_4$ gas (i.e. Si) at 21 nanomoles per minute. The semiconductor layer 30 was deposited to a thickness of about 150 nanometers on the buffer region 2.

Constructed and fabricated as above, the MESFET has proved to have all the advantages enumerated in connection with the FIG. 1 HEMT.

Figure 6:
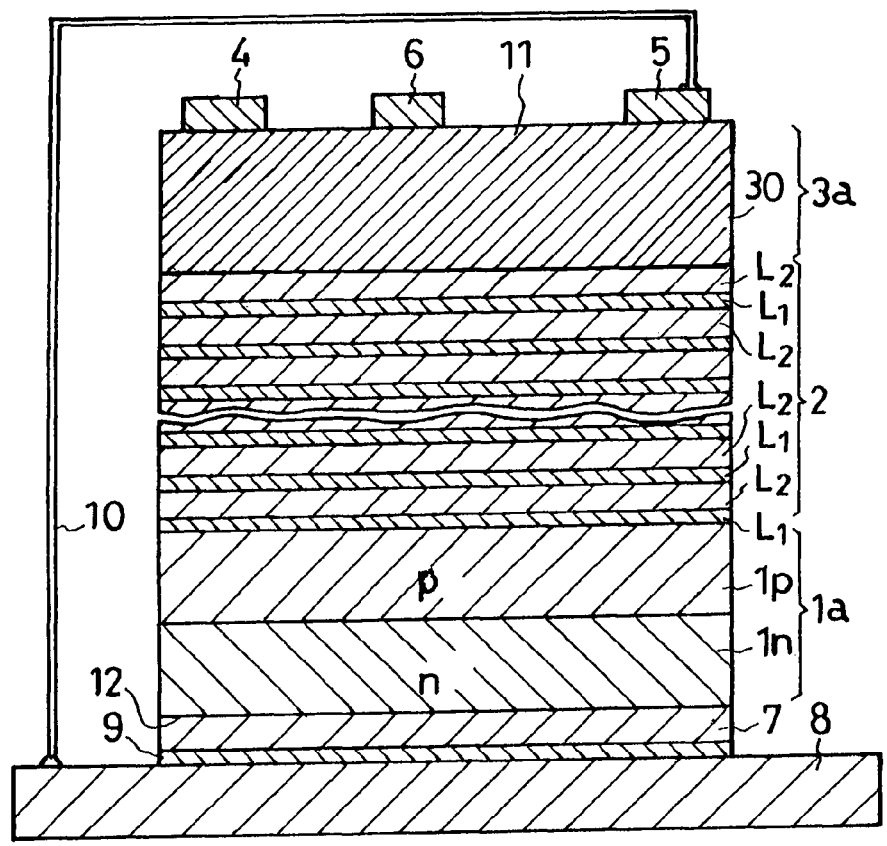
FIG. 6 is a view similar to FIG. 1 but showing another preferred form of MESFET according to the invention.

Embodiment of FIG. 6

Another MESFET shown in FIG. 6 is similar in construction to the FIG. 3 HEMT except for the makeup of a main semiconductor region $3_a$ adopted in substitution for its HEMT counterpart 3. The main semiconductor region $3_a$ of the MESFET is constructed and fabricated just like that designated by the same reference characters in FIG. 5. It is therefore apparent that this MESFET gains all the advantages as does the HEMT of FIGS. 1-5.

Figure 7:
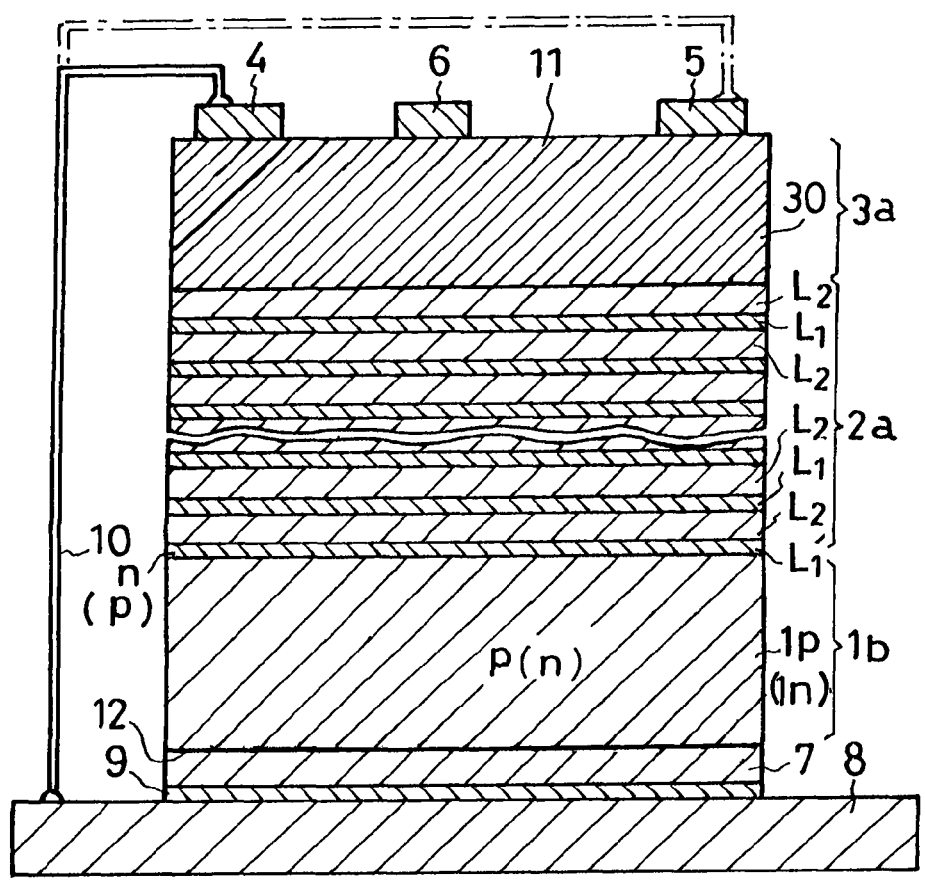
FIG. 7 is a view similar to FIG. 1 but showing still another preferred form of MESFET according to the invention.

Embodiment of FIG. 7

Still another MESFET of FIG. 7 represents a replacement of the main semiconductor region 3 of the FIG. 4 HEMT with the main semiconductor region $3_a$ of the MESFETs shown in FIGS. 5 and 6. This MESFET also possesses all the advantages as does the HEMT of FIGS. 1 and 2.

Possible Modifications

Notwithstanding the foregoing detailed disclosure it is not desired that the present invention be limited by the exact showings of the drawings or the description thereof. The following is a brief list of possible modifications, alterations or adaptations of the illustrated semiconductor devices which are all believed to fall within the purview of the claims annexed hereto:

1. The silicon substrate 1, $1_a$ or $1_b$ of the illustrated embodiments could be bonded directly to the metal-made baseplate 8 instead of via the back electrode 7.
2. The back electrode 7 could be electrically coupled to the source 4 or drain 4 vi a conductor extending interiorly, rather than exteriorly as in the illustrated embodiments, of the substrate 1, $1_a$ or $1_b$, buffer region 2 or $2_a$, and main semiconductor region 3 or $3_a$.

3. The second layers $L_2$ of the buffer region 2 or $2_a$ could be doped with magnesium or the like into p-type conductivity. An additional pn junction would then be obtained between the electron transit layer 31 of n-like conductivity, FIGS. 1, 3 and 4, and the multilayered buffer region 2 or $2_a$, as well as between the n-type semiconductor layer 30, FIGS. 5, 6 and 7, and the multilayered buffer region 2 or $2_a$. Such an additional pn junction would conduce to further improvement of antivoltage strength between the source 4 or drain 5 and the back electrode 7.
4. For the same purpose, a p-type impurity may be added to part or all of the buffer region 2, FIGS. 1 and 5, thereby creating an additional pn junction or junctions between substrate 1 and buffer region 2 and/or between buffer region 2 and n-type semiconductor region 30 or electron transit layer 31. Such an additional pn junction would conduce to improvement of antivoltage strength between the source 4 or drain 5 and the back electrode 7.
5. The same purpose is also attainable by assigning different conductivity types to the first and the second layers $L_1$ and $L_2$ of the buffer region 2 and thereby creating additional pn junctions between these constituent layers of the buffer region. Such an additional pn junction would conduce to improvement of antivoltage strength between the source 4 or drain 5 and the back electrode 7.
6. Additional layers could be interposed between the first and the second layers $L_1$ and $L_2$ of the buffer region 2 or $2_a$ in order to preclude or reduce the appearance of two-dimensional electron gas layers between the first and the second buffer layers.
7. The buffer region 2 or $2_a$ could be omitted or constituted of a single layer of GaN or other nitride semiconductors.
8. The substrate 1 could be of polycrystalline silicon or of a silicon compound such as SiC.
9. The constituent layer or layers of the main semiconductor region 3 or $3_a$ are reversible in conductivity type.
10. The constituent layer or layers of the main semiconductor region 3 or $3_a$ could be of gallium- or indium-nitride-based semiconductors such as GaN, AlInN, AlGaN, InGaN, and AlInGaN.
11. In the HEMTs of FIGS. 1, 3 and 4 another electron supply layer could be interposed between buffer layer 2 and electron transit layer 31.
12. Instead of electrically interconnecting the source 4 and back electrode 7 as in all the illustrated embodiments, either source 4 or drain 5 could be connected to some voltage source, and the back electrode 7 to the same voltage source or to another voltage source, thereby holding the source or drain at the same potential as, or at a preassigned different potential from, the back electrode.
13. The invention is applicable to semiconductor devices other than HEMTs and MESFETs.

What is claimed:

1. A semiconductor device comprising:
   (a) a substrate made from silicon or a silicon compound, the substrate having a pair of opposite major surfaces, a first semiconductor region of a first conductivity type and a second semiconductor region of a second conductivity type, opposite to the first conductivity type, the first semiconductor region and the second semiconductor region being adapted to provide a pn junction therebetween, all of the pn junction being disposed in parallel with the major surfaces of the substrate;
   (b) a main semiconductor region formed on one of a pair of opposite major surfaces of said substrate and having at least one nitride semiconductor layer;
   (c) a source and a drain electrode on said main semiconductor region;
   (d) a gate electrode disposed between, and spaced from, said source and said drain electrodes on said main semiconductor region for controlling conduction between said source and said drain electrodes via said main semiconductor region;
   (e) a back electrode formed on the other of the pair of opposite major surfaces of said substrate; and
   (f) a conductor connecting said back electrode to said source or said drain electrode, wherein said conductor does not touch said main semiconductor region directly.

2. A semiconductor device as defined in claim 1, further comprising a buffer region of a nitride semiconductor between said substrate and said main semiconductor region.

3. A semiconductor device as defined in claim 2, wherein said substrate and said buffer region are adapted to provide a pn junction therebetween.

4. A semiconductor device as defined in claim 2, wherein said buffer region comprises a plurality of semiconductor layers which are adapted to provide a pn junction therebetween.

5. A semiconductor device comprising:
   (a) a substrate made from silicon or a silicon compound, the substrate having a first conductivity type;
   (b) a buffer region formed on one of a pair of opposite major surfaces of said substrate, the buffer region having a nitride semiconductor layer of a second conductivity type, opposite to the first conductivity type, the nitride semiconductor layer and said substrate being adapted to provide a pn junction therebetween;
   (c) a main semiconductor region formed on said buffer region and having at least one nitride semiconductor layer;
   (d) a source and a drain electrode on said main semiconductor region;
   (e) a gate electrode disposed between, and spaced from, said source and said drain electrodes on said main semiconductor region for controlling conduction between said source and said drain electrodes via said main semiconductor region;
   (f) a back electrode formed on the other of the pair of opposite major surfaces of said substrate; and
   (g) a conductor connecting said back electrode to said source or said drain electrode, wherein said conductor does not touch said main semiconductor region directly.

6. A semiconductor device as defined in claim 5, wherein said buffer region is a lamination of a plurality of buffer layers including one which is in direct contact with said substrate, said one buffer layer being opposite in conductivity type to said substrate.

* * * * *